(12) United States Patent
Dodson (10) Patent No.: US 8,196,013 B2
(45) Date of Patent: Jun. 5, 2012

(54) SUPPORTING GLOBAL INPUT/OUTPUT INTERCONNECT FEATURES ON PORTS OF A MIDPOINT DEVICE

(75) Inventor: Jeffrey Michael Dodson, Portland, OR (US)

(73) Assignee: PLX Technology, Inc., Sunnyvale, CA (US)

( * ) Notice: Subject to any disclaimer, the term of this patent is extended or adjusted under 35 U.S.C. 154(b) by 434 days.

(21) Appl. No.: 12/605,110

(22) Filed: Oct. 23, 2009

(65) Prior Publication Data

US 2011/0099456 A1   Apr. 28, 2011

(51) Int. Cl.
*G06F 11/00* (2006.01)
(52) U.S. Cl. ........................................................ 714/758
(58) Field of Classification Search .................... 714/758
See application file for complete search history.

(56) References Cited

U.S. PATENT DOCUMENTS

| | | | | |
|---|---|---|---|---|
| 6,647,528 | B1 * | 11/2003 | Collette et al. | 714/758 |
| 7,010,607 | B1 * | 3/2006 | Bunton | 709/228 |
| 7,210,000 | B2 * | 4/2007 | Creta et al. | 710/316 |
| 7,457,897 | B1 * | 11/2008 | Lee et al. | 710/74 |
| 7,873,068 | B2 * | 1/2011 | Klinglesmith et al. | 370/463 |
| 8,010,860 | B2 * | 8/2011 | Jenkins et al. | 714/748 |
| 2006/0239287 | A1 * | 10/2006 | Johnsen et al. | 370/412 |
| 2006/0242353 | A1 * | 10/2006 | Torudbakken et al. | 710/316 |
| 2009/0006711 | A1 * | 1/2009 | Biran et al. | 710/316 |
| 2009/0006932 | A1 * | 1/2009 | Biran et al. | 714/807 |
| 2009/0185580 | A1 * | 7/2009 | Wagh | 370/473 |
| 2010/0162066 | A1 * | 6/2010 | Papirla et al. | 714/746 |

* cited by examiner

*Primary Examiner* — Scott Baderman
*Assistant Examiner* — Elmira Mehrmanesh
(74) *Attorney, Agent, or Firm* — Beyer Law Group LLP (57) ABSTRACT

In a first embodiment of the present invention, a method for operating a midpoint device utilizing an Input/Output (I/O) interconnect is provided, wherein the midpoint device contains a plurality of ports, the method comprising: receiving a request to initiate a session between a device on a first port of the midpoint device and a device on a second port of the midpoint device; retrieving information regarding whether the first port supports a feature, and information regarding whether the second port supports the feature; and when the first port supports the feature and the second port does not support the feature, permitting the session to be initiated, such that communications between the first device and the second device are performed partially using the feature, independently of support of the feature on other ports.

22 Claims, 9 Drawing Sheets

SUPPORTING GLOBAL INPUT/OUTPUT INTERCONNECT FEATURES ON PORTS OF A MIDPOINT DEVICE

BACKGROUND OF THE INVENTION

1. Field of the Invention

The present invention relates generally to Input/Output interconnects. More particularly, the present invention relates to supporting global input/output interconnect features on ports of a midpoint device.

2. Description of the Related Art

In end-to-end network, sessions are negotiated and packets encoded/decoded at end points in the network. Thus, if a first device encodes a packet according to an agreed-upon protocol and then sends the packet to a second device that shares the protocol, the second device will decode the packet.

A common data protection feature of end-to-end networks is an end-to-end cyclical redundancy check (ECRC). This involves the embedding of a code, known as the CRC code, in a packet. This CRC code may be, for example, a calculated short, fixed-length binary sequence for each block of data. The code is then sent along with the block when the block is transmitted to another device. When the block is read or received the end point device repeats the calculation. If the new calculated CRC does not match (or in some cases, cancel out) the earlier calculated code, then the block contains a data error and the end point device may take corrective action such as rereading or requesting the block be sent again.

On major source of CRC errors is alpha ($\alpha$) particle contamination that may be existent or occur when data is written to memory. Alpha particles can cause what is termed a 'soft error', which is a change of charge on a line that may cause the incorrect state to be saved. Most commonly these affect Static Random Access Memories (SRAMs) due to their high density of storage states, although any stateful logic can be affected. Consequently, a proper CRC check has become a necessary aspect of data communications.

There are many different computer I/O interconnect standards available. One of the most popular over the years has been the peripheral component interconnect (PCI) standard. PCI allows a bus to act like a bridge, which isolates a local processor bus from the peripherals, allowing a Central Processing Unit (CPU) of the computer to run much faster.

Recently, a successor to PCI has been popularized. Termed PCI Express (or, simply, PCIe), PCIe provides higher performance, increased flexibility and scalability for next-generation systems, while maintaining software compatibility with existing PCI applications. Compared to legacy PCI, the PCI Express protocol is considerably more complex, with three layers—the transaction, data link and physical layers.

In a PCI Express system, a root complex device connects the processor and memory subsystem to the PCI Express midpoint device fabric comprised of zero or more midpoint device devices. In PCI Express, a point-to-point architecture is used. Similar to a host bridge in a PCI system, the root complex generates transaction requests on behalf of the processor, which is interconnected through a local I/O interconnect. Root complex functionality may be implemented as a discrete device, or may be integrated with the processor. A root complex may contain more than one PCI Express port and multiple midpoint device devices can be connected to ports on the root complex or cascaded.

A PCIe midpoint device can be used to operate the PCIe intercommunication standard. The midpoint device contains multiple ports that each connect to a different device. As described previously, ECRC is desired to be implemented in PCIe. However, not all devices support ECRC. Because ECRC requires an end-to-end connection, if a receiving device does not support ECRC than any communications to the device, even if sent by devices that do support ECRC, do not utilize ECRC and thus are at risk for the data protection issues mentioned earlier.

Figure 1:
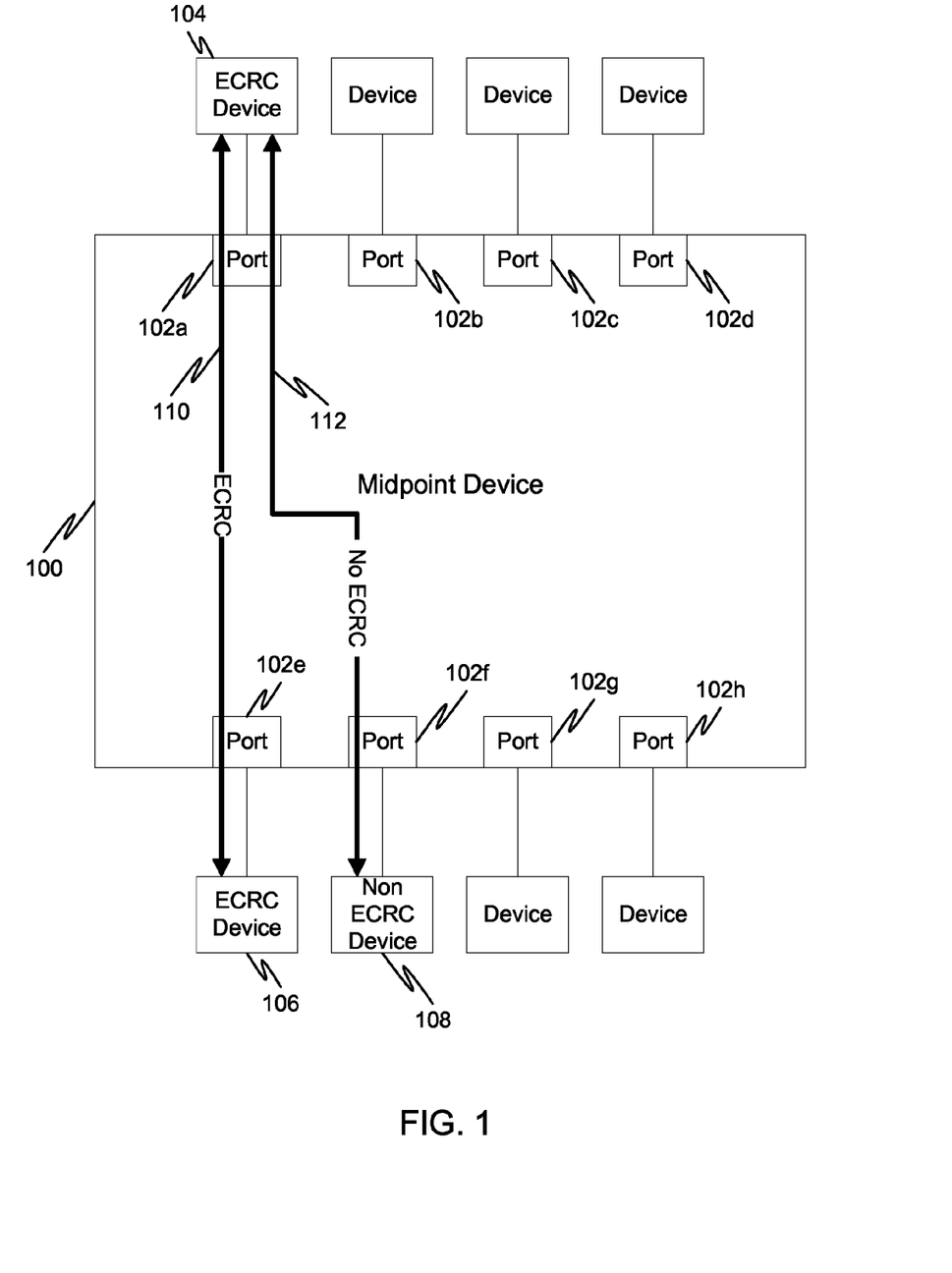
FIG. 1 is a block diagram illustrating a PCIe midpoint device having multiple ports where some of the connected devices support ECRC and some of the connected devices do not, as is known in the art.

Referring to FIG. 1, a PCIe midpoint device 100 may have multiple ports 102a-102h. If device 104 supports ECRC and device 106 also supports ECRC, then communication 106 between devices 104 and 106 through PCIe midpoint device 100 is performed using ECRC. However, if device 110 does not support ECRC, then communication 112 between devices 104 and 108 through PCIe midpoint device 100 is not performed using ECRC for any portion of that path.

Figure 2:
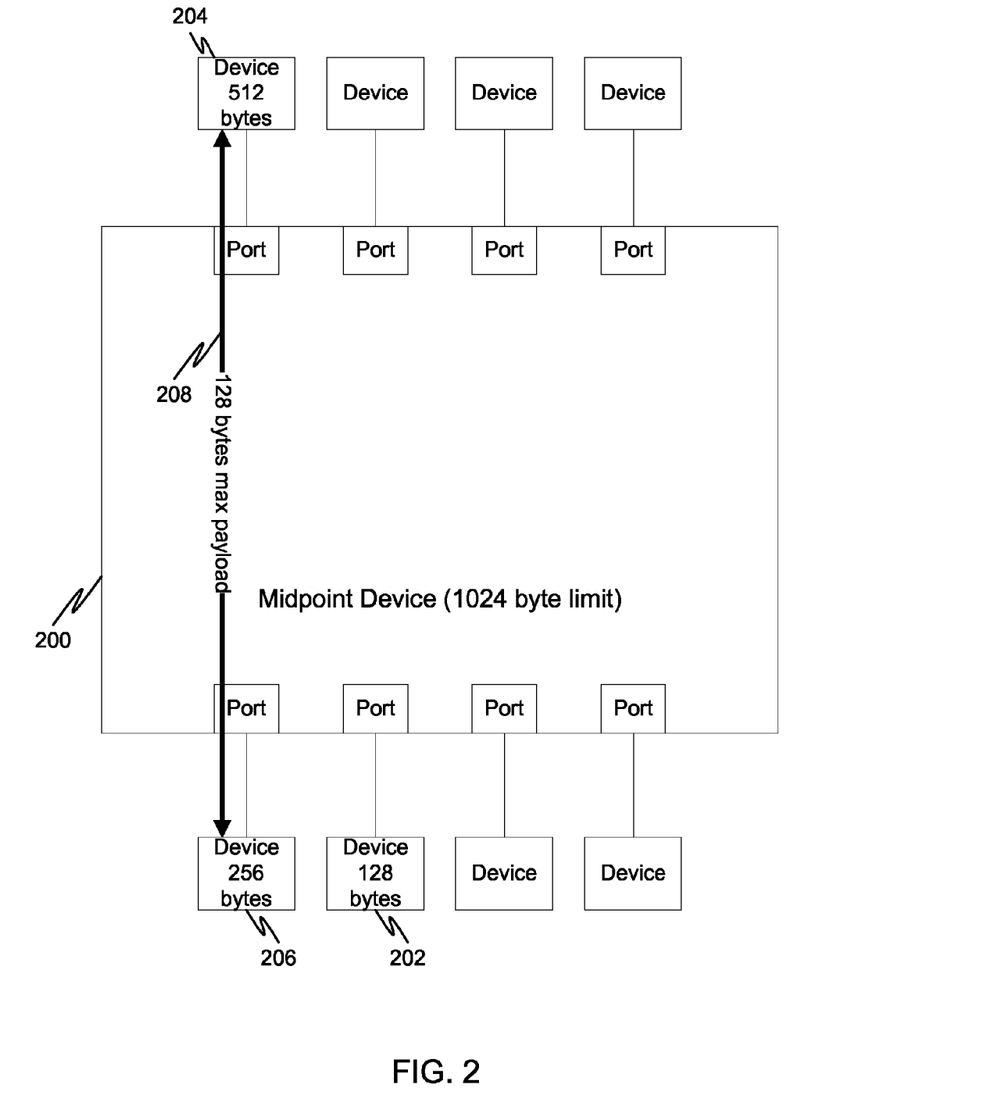
FIG. 2 is a block diagram illustrating a PCIe midpoint device having multiple ports wherein some of the connected devices support maximum payload sizes different than other connected devices, as is known in the art.

A similar problem occurs with maximum payload sizes of packets. Referring to FIG. 2, typically, a maximum payload size is set and all devices connected to PCIe midpoint device 200 must abide by the maximum payload size, even if individual devices support a higher payload size. Thus, if the maximum payload size in the system is 128 bytes, due to device 202 only supporting a maximum payload size of 128 bytes, while device 204 supports a maximum payload size of 512 bytes and device 206 supports a maximum payload size of 256 bytes, then a communication 208 between device 204 and device 206 will have a maximum payload size of 128 bytes, requiring more packets in order to send the same payload. There is a typical overhead of about 20-28 bytes per payload, thus the larger the payloads the more efficient the system runs.

Additionally, the system-wide payload size is typically set at the lowest payload size of any of the devices connected to the midpoint device 200. This, however, creates an unfortunate situation where a single device with a lower maximum payload size, such as an inexpensive endpoint added to an enterprise class system, will reduce the capability of the rest of the system. Indeed, a system thoroughly tested for performance may meet benchmarks, only to have system performance degrade when someone adds in a new endpoint in the field.

SUMMARY OF THE INVENTION

In a first embodiment of the present invention, a method for operating a midpoint device utilizing an Input/Output (I/O) interconnect is provided, wherein the midpoint device contains a plurality of ports, the method comprising: receiving a request to initiate a session between a device on a first port of the midpoint device and a device on a second port of the midpoint device; retrieving information regarding whether the first port supports a feature, and information regarding whether the second port supports the feature; and when the first port supports the feature and the second port does not support the feature, permitting the session to be initiated, such that communications between the first device and the second device are performed partially using the feature, independently of support of the feature on other ports.

In a second embodiment of the present invention, a method for providing End-to-End Cyclical Redundancy Checking (ECRC) in an Input/Output (I/O) interconnect having a midpoint device, wherein the midpoint device has a plurality of ports is provided, the method comprising: receiving a request to initiate a session between a device on a first port of the midpoint device and a device on a second port of the midpoint device; determining whether the first and second ports support ECRC; when one of the first and second ports supports ECRC, but the other does not: initiating a first session between the midpoint device and the device on the one of the ports that supports ECRC such that communications in the first session utilize ECRC; and initiating a second session between the midpoint device and the device on the one of the ports that does not support ECRC such that communications in the second session do not utilize ECRC.

In a third embodiment of the present invention, a method for providing per-port maximum packet payload sizes in an Input/Output (I/O) interconnect having a midpoint device is provided, wherein the midpoint device has a plurality of ports, the method comprising: receiving a request to initiate a session between a device on a first port of the midpoint device and a device on a second port of the midpoint device; retrieving a maximum payload size for the device on the first port by accessing a first entry in a data structure, the first entry corresponding to the first port; retrieving a maximum payload size for the device on the second port by accessing a second entry in the data structure, the second entry corresponding to the second port; and establishing a session between the device on the first port and the device on the second port, using the maximum payload size for the device on the first port and the maximum payload size for the device on the second port, independently of support of the feature on other ports.

In a fourth embodiment of the present invention, an Input/Output (I/O) interconnect midpoint device is provided comprising: a plurality of ports; a memory storing a data structure, wherein the data structure includes entries for each of the ports, wherein each entry includes information regarding whether the corresponding port supports a feature; and a processor configured to: receive a request to initiate a session between a device on a first port of the midpoint device and a device on a second port of the midpoint device; retrieve information regarding whether the first port supports a feature, and information regarding whether the second port supports the feature; and when the first port supports the feature and the second port does not support the feature, permit the session to be initiated, such that communications between the first device and the second device are performed partially using the feature.

In a fifth embodiment of the present invention, an apparatus for providing End-to-End Cyclical Redundancy Checking (ECRC) in an Input/Output (I/O) interconnect having a midpoint device is provided, wherein the midpoint device has a plurality of ports, the apparatus comprising: means for receiving a request to initiate a session between a device on a first port of the midpoint device and a device on a second port of the midpoint device; means for determining whether the first and second ports support ECRC; means for, when one of the first and second ports supports ECRC, but the other does not: initiating a first session between the midpoint device and the device on the one of the ports that supports ECRC such that communications in the first session utilize ECRC; and initiating a second session between the midpoint device and the device on the one of the ports that does not support ECRC such that communications in the second session do not utilize ECRC.

In a sixth embodiment of the present invention, an apparatus for providing per-port maximum packet payload sizes in an Input/Output (I/O) interconnect having a midpoint device is provided, wherein the midpoint device has a plurality of ports, the apparatus comprising: means for receiving a request to initiate a session between a device on a first port of the midpoint device and a device on a second port of the midpoint device; means for retrieving a maximum payload size for the device on the first port by accessing a first entry in a data structure, the second entry corresponding to the first port; means for retrieving a maximum payload size for the device on the second port by accessing a second entry in the data structure, the second entry corresponding to the second port; and means for establishing a session between the device on the first port and the device on the second port, using the maximum payload size for the device on the first port and the maximum payload size for the device on the second port.

DETAILED DESCRIPTION OF SPECIFIC EMBODIMENTS

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, specific details are set forth in order to provide a thorough understanding of the present invention. The present invention may be practiced without some or all of these specific details. In addition, well known features may not have been described in detail to avoid unnecessarily obscuring the invention.

In accordance with the present invention, the components, process steps, and/or data structures may be implemented using various types of operating systems, programming languages, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein. The present invention may also be tangibly embodied as a set of computer instructions stored on a computer readable medium, such as a memory device.

In an embodiment of the present invention, device resources connected to a midpoint device in a computer input/output (I/O) interconnect are implemented on a per port, rather than per system basis. It should be noted that while the inventions described in this document are discussed in relation to the PCIe protocol, nothing in this document shall be construed as limiting the invention to the PCIe protocol unless expressly indicated. The inventions may be applied to other computer I/O interconnects unrelated to PCIe.

It should be noted that throughout this document, the term "midpoint device" is used. This term is meant to refer to a device located between two PCIe endpoints. One common example of a midpoint device is a switch. However, nothing in this document shall be construed as limiting the embodiments to only switches, absent express language to the contrary. Additionally, the midpoint device may be located anywhere between the two endpoints. It is not necessary that the midpoint device be located at or near any geographical or logical midpoint between the endpoints, only that it be logically located somewhere between the two endpoints. Indeed, embodiments are even possible where the midpoint device is located on the same physical device as one of the endpoints.

Figure 3:
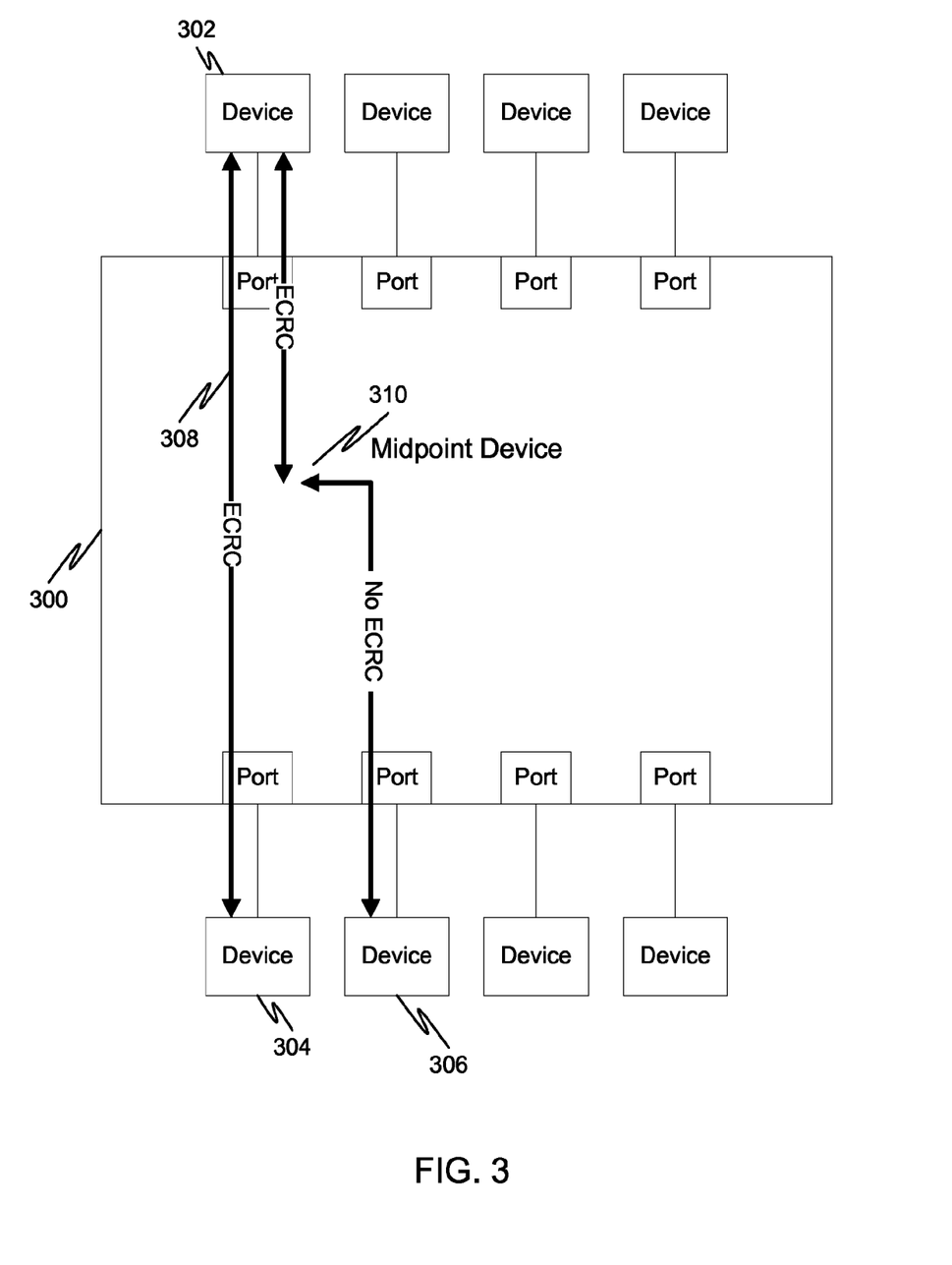
FIG. 3 is a block diagram illustrating a PCIe midpoint device having multiple ports where some of the connected devices support ECRC and some of the connected devices do not, in accordance with an embodiment of the present invention

In one embodiment of the present invention, ECRC capabilities are turned on or off on a per port basis. This is depicted in FIG. 3. As can be seen, FIG. 3 is similar to FIG. 1 in that a midpoint device 300 is provided where devices 302 and 304 have ECRC capabilities while device 306 does not. As with FIG. 1, communications 308 between devices 302 and 304 continue to be performed with full ECRC capabilities along the full path of the communications. In this embodiment of the present invention, however, partial ECRC capabilities are provided to communications 310 between device 302 and 306. Specifically, midpoint device 300 acts as a temporary end point for communications, allowing communications 310 between device 302 and midpoint device 300 to utilize ECRC, even though the communications will eventually arrive at device 308, which does not support ECRC.

The midpoint device 300 may maintain some sort of data structure, such as a table, that contains information as to which ports have ECRC turned on and which have them turned off. Midpoint device 300 may then also be configured to perform traditional ECRC checks, in order to act as the endpoint and provide ECRC functionality for communication legs from devices on ports that have ECRC turned on to the midpoint device. Additionally, the midpoint device may also be configured to add ECRC to packets destined for devices on ports that have ECRC turned on, to provide ECRC functionality for communication lefts from the midpoint device to the devices on ports that have ECRC turned on.

This allows the system as a whole to provide partial ECRC protection for communications that previously would have no ECRC protection.

Another embodiment is possible where ECRC protection is provided even when the sending device does not support ECRC. Here, the midpoint device may add ECRC to the communications, allowing for ECRC at least for the leg between the midpoint device and the destination device.

Figure 4:
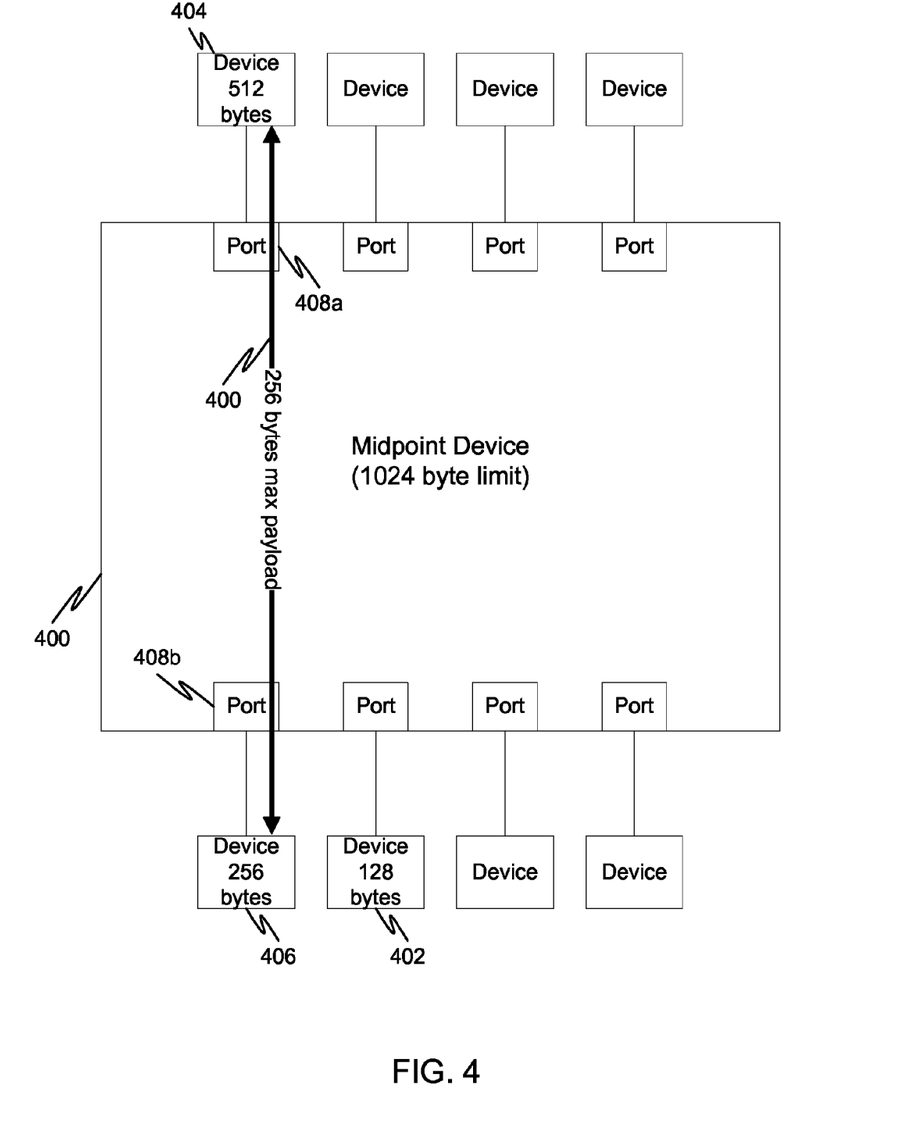
FIG. 4 is a block diagram illustrating a PCIe midpoint device having multiple ports wherein some of the connected devices support maximum payload sizes different than other connected devices, in accordance with another embodiment of the present invention.

In another embodiment of the present invention, maximum payloads are set on per port basis. This is depicted in FIG. 4. As can be seen, FIG. 4 is similar to FIG. 2 in that a midpoint device 400 is provided while device 402 supports a maximum payload size of 128 bytes, device 404 supports a maximum payload size of 512 bytes and device 406 supports a maximum payload size of 256 bytes. By allowing the payload size to be set by port, maximum payload size of packets sent from device 404 to device 406 can be increased from the 128 bytes shown in FIG. 2. A data structure, such as a table, may be maintained by the midpoint device 400 in order to keep track of the maximum payload sizes for each of the ports. When a communication occurs between two ports, the table is accessed and the maximum payload sizes for each port is retrieved. In the embodiment depicted in FIG. 4, the entire session 408 between device 404 and device 406 is performed at a maximum payload size of 256 bytes, the greatest common factor of the maximum payload sizes for devices 404 and 406 as retrieved based on port.

Figure 5:
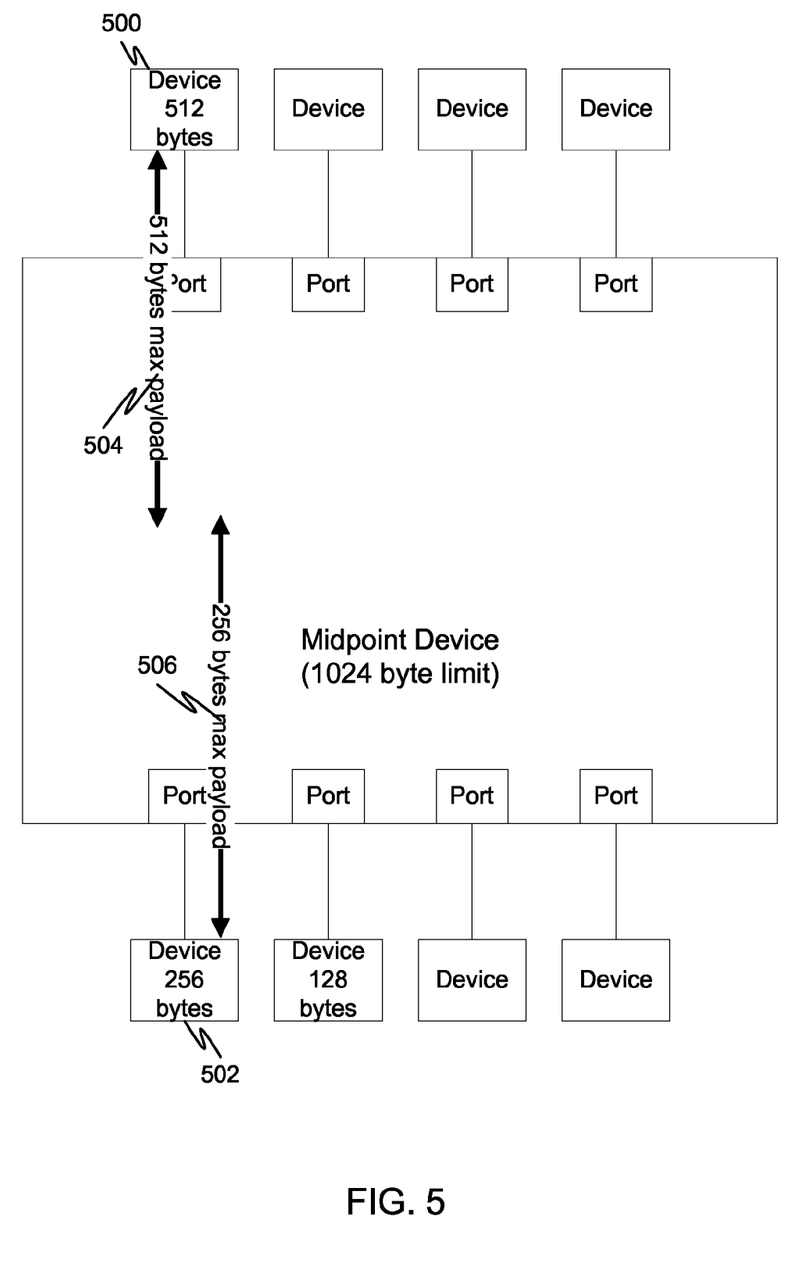
FIG. 5 is a block diagram illustrating another PCIe midpoint device having multiple ports wherein some of the connected devices support maximum payload sizes different than other connected devices, in accordance with another embodiment of the present invention.

FIG. 5 is another embodiment of a midpoint device supporting per-port maximum packet payload sizes. This embodiment is identical to that of FIG. 4, except when communication occurs between device 500 and device 502, the communication is split into two sessions. The first session 504 is performed using the maximum payload size of device 500, namely 512 bytes, while the second session 506 is performed using the maximum payload size of device 602, namely 256 bytes.

Notably, neither of these results could occur if the maximum payload size is set at a system-wide level, as in the prior art. Specifically, even if the system-wide payload size was set at the greatest common factor of all the devices, communications between device 500 and device 502 would be unnecessarily limited to 128 bytes while (at least) 256 byte payload sizes for those communications were available. This adds inefficiency into the system as the packets would have to be unnecessarily split and the overhead associated with each packet would cause the system to operate in a less than ideal manner. Likewise, if the system-wide payload size was increased to 256 bytes, then communications with a device having a maximum packet payload size of 128 bytes would cause errors. Thus, the present invention prevents low maximum payload size devices, such as an inexpensive diagnostic endpoint added to an enterprise class system, from reducing the capability of the rest of the system.

Figure 6:
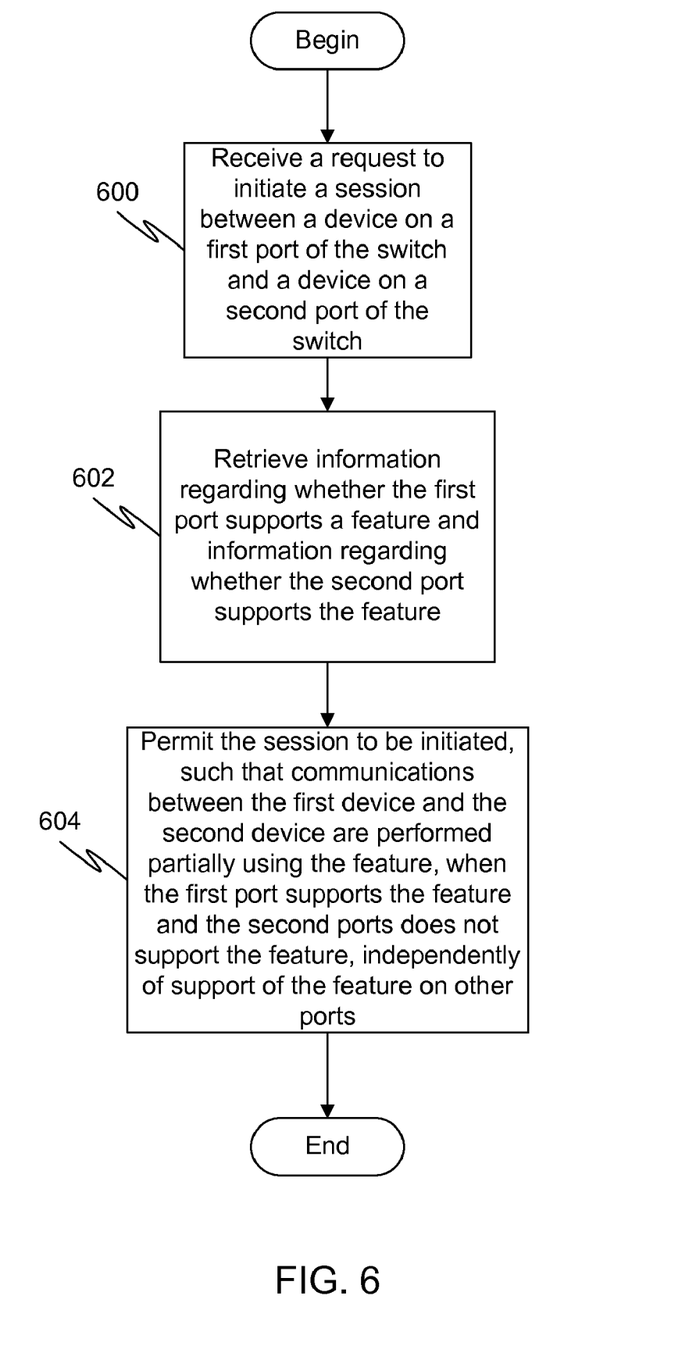
FIG. 6 is a flow diagram illustrating a method for operating a midpoint device utilizing an I/O interconnect, wherein the midpoint device contains a plurality of ports, in accordance with an embodiment of the present invention.

FIG. 6 is a flow diagram illustrating a method for operating a midpoint device utilizing an I/O interconnect, wherein the midpoint device contains a plurality of ports, in accordance with an embodiment of the present invention. The midpoint device may be any type of I/O interconnect midpoint device. However, in one embodiment of the present invention the I/O interconnect midpoint device is a PCIe midpoint device. The method may be performed by the midpoint device.

At 600, a request to initiate a session between a device on a first port of the midpoint device and a device on a second port of the midpoint device is received. This request may come in many different forms and may come from many different sources. In one embodiment, it may come from the device on the first port of the midpoint device or the device on the second port of the midpoint device. In another embodiment of the present invention, it may come from a different device, such as a management device. In another embodiment of the present invention, it may be passed by a proxy. As to the form of the request, it may be en explicit request to begin a session, such as a session initiation packet. However, in other embodiments the request may be implicit, such as merely an attempt by one device attached to the midpoint device to communicate with another device attached to the midpoint device in the absence of a preexisting session.

At 602, information regarding whether the first port supports a feature and information regarding whether the second port supports the feature is retrieved. This may, for example, be retrieved from a data structure accessible by the midpoint device. In one embodiment of the present invention, this data structure is stored in memory in the midpoint device. However, embodiments are possible where the data is stored elsewhere. For example, the data structure may be stored in an external memory connected to the midpoint device. In other embodiments, the midpoint device never directly accesses the data structure, but is simply informed of the optimal feature or feature level and enforces it.

The data structure itself may take many forms. In one embodiment of the present invention, the data structure is a table having entries corresponding to each of the ports. The entries themselves then indicate whether the corresponding port supports the feature. It should be noted that in many cases a port supports a feature when there is some indication that the device connected to the port supports the feature. However, embodiments are possible where other factors influence whether or not the port supports a feature, such as the transmission medium between the port of the midpoint device and the corresponding device.

The type of feature involved can also take many forms. In one embodiment, the feature is either fully supported or fully unsupported by each of the ports. In another embodiment, the feature is a certain level of capability, where one port could support the feature by supporting a higher level of the capability while another port may be considered to not support the feature if it only supports a lower level of the capability. Embodiments are described below wherein the feature is ECRC or a maximum payload size for packets, but other features are possible as well and nothing in this document shall be construed as limiting the scope of the claims to those particular features unless explicitly mentioned.

At 604, the session is permitted to be initiated, such that communications between the first device and the second device are performed partially using the feature, independently of support of the feature on other ports, when the first port supports the feature and the second port does not support the feature. This partial use of the feature may take many forms. In one embodiment, communications between the device on the first port utilize the feature for the portion of the communications conducted between the device on the first port and the midpoint device. This may be accomplished, for example, by establishing two distinct sessions, one between the device on the first port and the midpoint device, and the other between the device on the second port and the midpoint device. Each of these sessions may then either use or not use the feature depending upon whether the corresponding port supports the feature. In some embodiments, establishing and operating such sessions may require additional capabilities on the part of the midpoint device, such as the ability to calculate and compare ECRC packets, or to split a packet into multiple packets. In the embodiment where the feature represents a level at which a particular capability can be provided, the session is initiated such that communications between the first device and the second device are performed at a level representing a greatest common factor of the level at which the particular capability can be provided by the first port and the level at which the particular capability can be provided by the second port.

Figure 7:
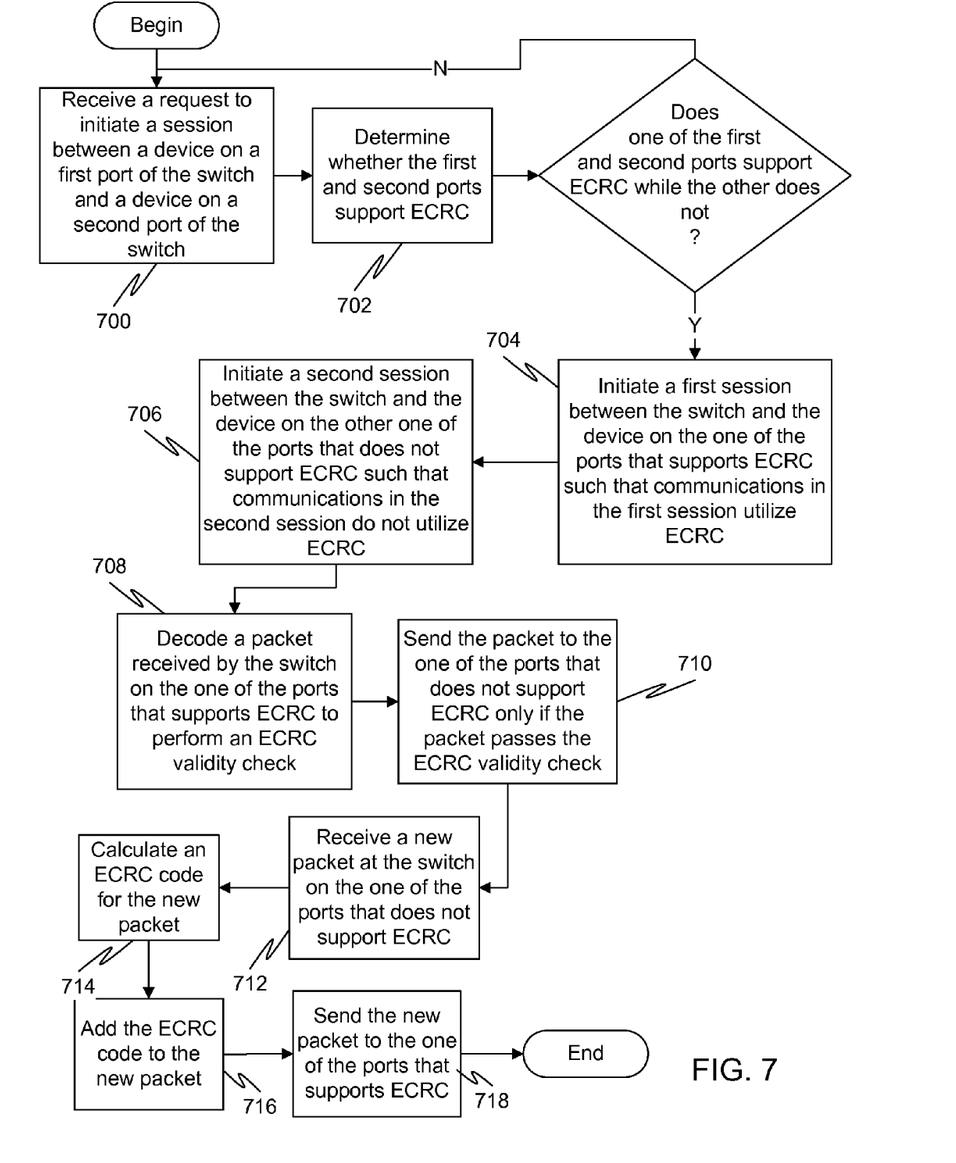
FIG. 7 is a flow diagram illustrating a method for providing ECRC in an I/O interconnect having a midpoint device, wherein the midpoint device has a plurality of ports, in accordance with another embodiment of the present invention.

FIG. 7 is a flow diagram illustrating a method for providing ECRC in an I/O interconnect having a midpoint device, wherein the midpoint device has a plurality of ports, in accordance with another embodiment of the present invention. Once again, many different types of I/O interconnects may be used with this method, but in one embodiment of the present invention the I/O interconnect is a PCIe interconnect. Also, once again, the method may be performed by the midpoint device.

At 700, a request is received to initiate a session between a device on a first port of the midpoint device and a device on a second port of the midpoint device. This request may come in many different forms and may come from many different sources. In one embodiment, it may come from the device on the first port of the midpoint device or the device on the second port of the midpoint device. In another embodiment of the present invention, it may come from a different device, such as a management device. In another embodiment of the present invention, it may be passed by a proxy. As to the form of the request, it may be en explicit request to begin a session, such as a session initiation packet. However, in other embodiments the request may be implicit, such as merely an attempt by one device attached to the midpoint device to communicate with another device attached to the midpoint device in the absence of a preexisting session.

At 702, it is determined whether the first and second ports support ECRC. This may be accomplished, for example, by accessing a data structure in memory (either inside the midpoint device or outside). The data structure itself may take many forms. In one embodiment of the present invention, the data structure is a table having entries corresponding to each of the ports. The entries themselves then indicate whether the corresponding port supports ECRC.

When one of the first and second ports supports ECRC, but the other does not, then 704 and 706 are executed. At 704, a first session is initiated between the midpoint device and the device on the one of the ports that supports ECRC such that communications in the first session utilize ECRC. At 706, a second session is initiated between the midpoint device and the device on the one of the ports that does not support ECRC such that communications in the first session do not utilize ECRC. Thereafter, 708-722 may be executed.

708-710 cover the case where a packet is received from a device connected to a port supporting ECRC, wherein the packet destination is a device connected to a port not supporting ECRC. The incoming packet is checked to see whether an error has occurred using ECRC functionality.

At 708, a packet, received by the midpoint device on the one of the ports that supports ECRC, is decoded to perform an ECRC validity check. There are many ways in which may be performed. In one embodiment of the present invention, the cyclic redundancy check uses a high order polynomial to protect the integrity of the data. For example, a 32-bit ECRC may be calculated for the entire TLP (header and data payload). The calculation may be accomplished via different ECRC calculation techniques known in the art.

At 710, the packet is sent to the one of the ports that does not support ECRC only if the packet passes the ECRC validity check.

712-718 cover the case where a packet is received from a device connected to a port not supporting ECRC, wherein the packet destination is a device connected to a port supporting ECRC. ECRC is added to the packet so that ECRC checks may be conducted by the device connected to the port supporting ECRC.

At 712, a packet is received at the midpoint device on the one of the ports that does not support ECRC. At 714, an ECRC code is calculated for the packet. Once again, there may be many ways that this ECRC code is calculated, but in one embodiment the process described above with respect to 708 is utilized.

At 716, the ECRC code is added to the packet. At 718 the packet is sent to the one of the ports that supports ECRC.

Figure 8:
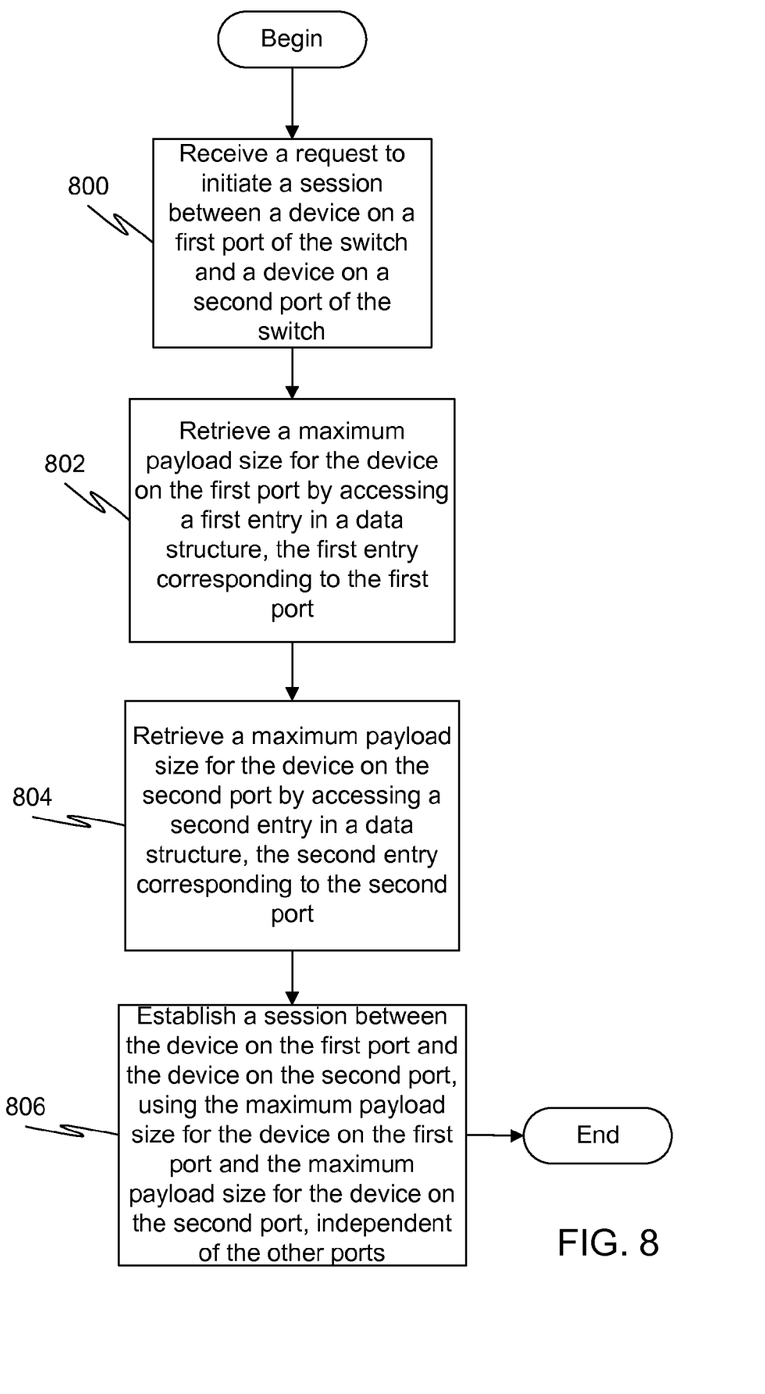
FIG. 8 is a flow diagram illustrating a method for providing per-pert maximum payload sizes in an I/O interconnect having a midpoint device, wherein the midpoint device has a plurality of ports, in accordance with another embodiment of the present invention.

FIG. 8 is a flow diagram illustrating a method for providing per-pert maximum payload sizes in an I/O interconnect having a midpoint device, wherein the midpoint device has a plurality of ports, in accordance with another embodiment of the present invention. Once again, many different types of I/O interconnects may be used with this method, but in one embodiment of the present invention the I/O interconnect is a PCIe interconnect. Also, once again, the method may be performed by the midpoint device.

At 800, a request to initiate a session between a device on a first port of the midpoint device and a device on a second port of the midpoint device is received. This request may come in many different forms and may come from many different sources. In one embodiment, it may come from the device on the first port of the midpoint device or the device on the second port of the midpoint device. In another embodiment of the present invention, it may come from a different device, such as a management device. In another embodiment of the present invention, it may be passed by a proxy. As to the form of the request, it may be en explicit request to begin a session, such as a session initiation packet. However, in other embodiments the request may be implicit, such as merely an attempt by one device attached to the midpoint device to communicate with another device attached to the midpoint device in the absence of a preexisting session.

At 802, a maximum payload size for the device on the first port is retrieved by accessing a first entry in a data structure, the first entry corresponding to the first port. The data structure itself may take many forms. In one embodiment of the present invention, the data structure is a table having entries corresponding to each of the ports. The entries themselves then indicate the maximum payload sizes for the devices on corresponding ports.

At 804, a maximum payload size for the device on the second port is retrieved by accessing a second entry in the data structure, the second entry corresponding to the second port.

At 806, a session is established between the device on the first port and the device on the second port, using the maximum payload size for the device on the first port and the maximum payload size for the device on the second port, independently of support of the feature on other ports. The way the maximum payload sizes for the devices on the first and second ports are used may vary based on implementation. In one embodiment of the present invention, the greatest common factor between the two maximum payload sizes is simply used as the maximum payload size for the entire session. Here, a first step would involve calculating the greatest common factor between the maximum payload size for the device on the first port and the maximum payload size for the device on the second port, and a second step would involve setting a maximum payload size for the session at the greatest common factor.

It should be noted that the midpoint device, as well as any other midpoint devices in the system involved in transmission of a payload may also affect the maximum payload size for the session. For example, 2 switches may be cascaded, and if one of the switches only supports a maximum protocol size of 128 bytes, then communications through that switch to the second switch (which may have a larger maximum protocol size) would be limited to the 128 bytes maximum payload size.

In another embodiment of the present invention, the session is actually split into two sessions, one session between the device on the first port and the midpoint device and the second session between the midpoint device and the device on the second port. The first session is then assigned the maximum payload size corresponding to the first port and the second session is assigned the maximum payload size corresponding to the second port. Depending upon which maximum payload size is larger, incoming packets from one session may then need to be split in order to meet the (lower) maximum payload size of the other session. Thus, for example, when the maximum payload size for the device on the first port is greater than the maximum payload size for the device on the second port and a packet is received at the midpoint device from the first port during the first session, the packet is split into a plurality of smaller packets, each of the plurality of smaller packets having a maximum payload size equal to the maximum payload size of the device on the second port. These packets can then be safely sent on the second port. Alternatively, when the maximum payload size for the device on the second port is greater than the maximum payload size for the device on the first port and a packet is received at the midpoint device from the second port during the second session, the packet is split into a plurality of smaller packets, each of the plurality of smaller packets having a maximum payload size equal to the maximum payload size of the device on the first port. These split packets can then be safely sent on the first port. It should be noted that splitting the packet with ECRC means regenerating ECRC on each of the smaller packets.

For example, a storage device may utilize 4 Kb block sizes since it is easy for them to send 4 Kb payloads. But the system may also include a switch with a maximum payload size of 2 Kb, and the rest of the system may have a maximum payload size of 128 b. In such a case, the overall maximum payload size may ordinarily be limited to 128 b payloads. The downstream port to the storage device may be narrower than the upstream port to the final destination. As a result, the throughput bottleneck is the rate on the downstream port. But allowing 2 Kb payloads instead of 128 b payloads, every 2 Kb payload requires only 20 b overhead as opposed to 320 b (16*20 b).

Figure 9:
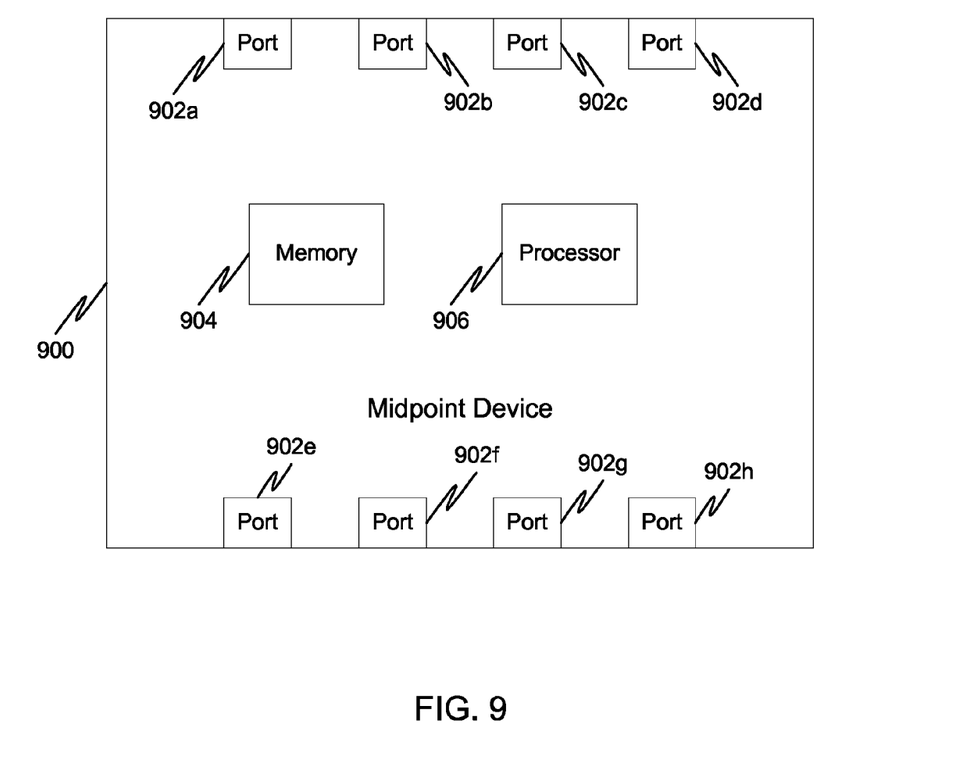
FIG. 9 is a block diagram illustrating an I/O interconnect midpoint device in accordance with another embodiment of the present invention.

FIG. 9 is a block diagram illustrating an I/O interconnect midpoint device in accordance with another embodiment of the present invention. The midpoint device may be any type of I/O interconnect midpoint device. However, in one embodiment of the present invention the I/O interconnect midpoint device is a PCIe midpoint device. The midpoint device 900 may include a plurality of ports 902a-902h. The midpoint device may also include a memory 904. This memory 904 may store a data structure, wherein the data structure includes entries for each of the ports, wherein each entry includes information regarding whether the corresponding port supports a feature, such as ECRC, or the maximum payload size. A processor 806 may then be configured to operate in a way to manage the midpoint device, including performing any combination of the processes or steps described above with respect to FIGS. 6-8.

It should also be noted that the functionality described above with respect to FIGS. 6-8 may be performed using software. However, hardware embodiments are possible as well. Specifically, dedicated circuitry or chips may be provided to implement any or all of the steps of FIGS. 6-8. Mixtures of hardware and software may also be utilized. In one embodiment, firmware may be used to store instructions for performing various steps of FIGS. 6-8.

While the invention has been particularly shown and described with reference to specific embodiments thereof, it will be understood by those skilled in the art that changes in the form and details of the disclosed embodiments may be made without departing from the spirit or scope of the invention. In addition, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. A method for operating a midpoint device utilizing an Input/Output (I/O) interconnect, wherein the midpoint device contains a plurality of ports, the method comprising:
    receiving a request to initiate a session between a device on a first port of the midpoint device and a device on a second port of the midpoint device, wherein the session is initiated so that communications between the device on the first port and the device on the second port utilize the feature for the portion of the communications conducted between the device on the first port and the midpoint device, wherein the session is initiated such that communications between the first device and second device are performed at a level representing a greatest common factor of the level at which the particular capability can be provided by the first port and the level at which the particular capability can be provided by the second port, independent of the other ports;
    retrieving information regarding whether the first port supports a feature, and information regarding whether the second port supports the feature; and
    when the first port supports the feature and the second port does not support the feature, permitting the session to be initiated, such that communications between the first device and the second device are performed partially using the feature, independently of support of the feature on other ports.

2. The method of claim 1, wherein the feature is either fully supported or fully unsupported by each of the ports, independent of the other ports.

3. The method of claim 1, wherein the session is initiated so that communications between the device on the first port and the device on the second port do not utilize the feature for the portion of the communications conducted between the midpoint device and the device on the second port.

4. The method of claim 1, wherein the feature reflects a level at which a particular capability can be provided by each of the ports.

5. The method of claim 1, wherein the I/O interconnect is a Peripheral Component Interconnect Express (PCIe) system.

6. A method for providing End-to-End Cyclical Redundancy Checking (ECRC) in an Input/Output (I/O) interconnect having a midpoint device, wherein the midpoint device has a plurality of ports, the method comprising:
    receiving a request to initiate a session between a device on a first port of the midpoint device and a device on a second port of the midpoint device;
    determining whether the first and second ports support ECRC;
    when one of the first and second ports supports ECRC, but the other does not:
        initiating a first session between the midpoint device and the device on the one of the ports that supports ECRC such that communications in the first session utilize ECRC;
        initiating a second session between the midpoint device and the device on the one of the ports that does not support ECRC such that communications in the second session do not utilize ECRC;
        decoding a packet, received by the midpoint device on the one of the ports that supports ECRC, to perform an ECRC validity check; and
        sending the packet to the one of the ports that does not support ECRC only if the packet passes the ECRC validity check.

7. The method of claim 6, wherein ECRC is either fully supported or fully unsupported by each of the ports, independent of the other ports.

8. The method of claim 6, wherein the I/O interconnect is a Peripheral Component Interconnect Express (PCIe) system.

9. A method for providing End-to-End Cyclical Redundancy Checking (ECRC) in an Input/Output (I/O) interconnect having a midpoint device, wherein the midpoint device has a plurality of ports, the method comprising:
    receiving a request to initiate a session between a device on a first port of the midpoint device and a device on a second port of the midpoint device;
    determining whether the first and second ports support ECRC;
    when one of the first and second ports supports ECRC, but the other does not:
        initiating a first session between the midpoint device and the device on the one of the ports that supports ECRC such that communications in the first session utilize ECRC;
        initiating a second session between the midpoint device and the device on the one of the ports that does not support ECRC such that communications in the second session do not utilize ECRC;
        receiving a packet at the midpoint device on the one of the ports that does not support ECRC;
        calculating an ECRC code for the packet;
        adding the ECRC code to the packet; and
        sending the packet to the one of the ports that does not support ECRC.

10. The method of claim 9, wherein ECRC is either fully supported or fully unsupported by each of the ports, independent of the other ports.

11. The method of claim 9, wherein the I/O interconnect is a Peripheral Component Interconnect Express (PCIe) system.

12. A method for providing per-port maximum packet payload sizes in an Input/Output (I/O) interconnect having a midpoint device, wherein the midpoint device has a plurality of ports, the method comprising:
    receiving a request to initiate a session between a device on a first port of the midpoint device and a device on a second port of the midpoint device;
    retrieving a maximum payload size for the device on the first port by accessing a first entry in a data structure, the first entry corresponding to the first port;
    retrieving a maximum payload size for the device on the second port by accessing a second entry in the data structure, the second entry corresponding to the second port;
    retrieving a maximum payload size for the midpoint device by accessing a third entry in the data structure, the third entry corresponding to the midpoint device; and
    establishing a session between the device on the first port and the device on the second port, using the maximum payload size for the device on the first port and the maximum payload size for the device on the second port, independently of support of the feature on other ports, wherein the establishing a session between the device on the first port and the device on the second port includes using the maximum payload size for the midpoint device.

13. The method of claim 12, wherein the establishing includes:
  calculating a greatest common factor between the maximum payload size for the device on the first port, the maximum payload size for the device on the second port, and the maximum payload size for the midpoint device; and
  setting a maximum payload size for the session at the greatest common factor between the maximum payload size for the device on the first port, the maximum payload size for the device on the second port, and the maximum payload size of the midpoint device.

14. A method for providing per-port maximum packet payload sizes in an Input/Output (I/O) interconnect having a midpoint device, wherein the midpoint device has a plurality of ports, the method comprising:
  receiving a request to initiate a session between a device on a first port of the midpoint device and a device on a second port of the midpoint device;
  retrieving a maximum payload size for the device on the first port by accessing a first entry in a data structure, the first entry corresponding to the first port;
  retrieving a maximum payload size for the device on the second port by accessing a second entry in the data structure, the second entry corresponding to the second port; and
  establishing a session between the device on the first port and the device on the second port, using the maximum payload size for the device on the first port and the maximum payload size for the device on the second port, independently of support of the feature on other ports,
  wherein the establishing includes:
    establishing a first session between the device on the first port and the midpoint device, the first session having a maximum payload size equal to the maximum payload size for the device on the first port, independent of the other ports; and
    establishing a second session between the device on the second port and the midpoint device, the second session having a maximum payload size equal to the maximum payload size for the device on the second port, independent of the other ports.

15. The method of claim 14, further comprising:
  when the maximum payload size for the device on the first port is greater than the maximum payload size for the device on the second port and a packet is received at the midpoint device from the first port during the first session:
    splitting the packet into a plurality of smaller packets, each of the plurality of smaller packets having a maximum payload size equal to the maximum payload size of the device on the second port.

16. The method of claim 14, further comprising:
  when the maximum payload size for the device on the second port is greater than the maximum payload size for the device on the first port and a packet is received at the midpoint device from the second port during the second session:
    splitting the packet into a plurality of smaller packets, each of the plurality of smaller packets having a maximum payload size equal to the maximum payload size of the device on the first port.

17. An Input/Output (I/O) interconnect midpoint device comprising:
  a plurality of ports;
  a memory storing a data structure, wherein the data structure includes entries for each of the ports, wherein each entry includes information regarding whether the corresponding port supports a feature; and
  a processor configured to:
    receive a request to initiate a session between a device on a first port of the midpoint device and a device on a second port of the midpoint device, wherein the session is initiated so that communications between the device on the first port and the device on the second port utilize the feature for the portion of the communications conducted between the device on the first port and the midpoint device, wherein the session is initiated such that communications between the first device and second device are performed at a level representing a greatest common factor of the level at which the particular capability can be provided by the first port and the level at which the particular capability can be provided by the second port, independent of the other ports;
    retrieve information regarding whether the first port supports a feature, and information regarding whether the second port supports the feature; and
    when the first port supports the feature and the second port does not support the feature, permit the session to be initiated, such that communications between the first device and the second device are performed partially using the feature.

18. The I/O interconnect midpoint device of claim 17, wherein the feature is ECRC.

19. The I/O interconnect midpoint device of claim 17, wherein the information in each entry in the data structure includes information regarding a maximum payload size supported by a device on the corresponding port.

20. The I/O interconnect midpoint device of claim 17, wherein the I/O interconnect midpoint device is a PCIe midpoint device.

21. An apparatus for providing End-to-End Cyclical Redundancy Checking (ECRC) in an Input/Output (I/O) interconnect having a midpoint device, wherein the midpoint device has a plurality of ports, the apparatus comprising:
  means for receiving a request to initiate a session between a device on a first port of the midpoint device and a device on a second port of the midpoint device;
  means for determining whether the first and second ports support ECRC;
  means for, when one of the first and second ports supports ECRC, but the other does not:
    initiating a first session between the midpoint device and the device on the one of the ports that supports ECRC such that communications in the first session utilize ECRC;
    initiating a second session between the midpoint device and the device on the one of the ports that does not support ECRC such that communications in the second session do not utilize ECRC;
    decoding a packet, received by the midpoint device on the one of the ports that supports ECRC, to perform an ECRC validity check; and
    sending the packet to the one of the ports that does not support ECRC only if the packet passes the ECRC validity check.

22. An apparatus for providing per-port maximum packet payload sizes in an Input/Output (I/O) interconnect having a midpoint device, wherein the midpoint device has a plurality of ports, the apparatus comprising:

means for receiving a request to initiate a session between a device on a first port of the midpoint device and a device on a second port of the midpoint device;

means for retrieving a maximum payload size for the device on the first port by accessing a first entry in a data structure, the second entry corresponding to the first port;

means for retrieving a maximum payload size for the device on the second port by accessing a second entry in the data structure, the second entry corresponding to the second port;

means for retrieving a maximum payload size for the midpoint device by accessing a third entry in the data structure, the third entry corresponding to the midpoint device; and means for establishing a session between the device on the first port and the device on the second port, using the maximum payload size for the device on the first port and the maximum payload size for the device on the second port, wherein the establishing a session between the device on the first port and the device on the second port includes using the maximum payload size for the midpoint device.

* * * * *